United States Patent [19]

Gal et al.

[11] Patent Number: 5,225,721
[45] Date of Patent: Jul. 6, 1993

[54] SIGNAL TRANSLATOR FOR INTERCONNECTING CMOS AND BICMOS LOGIC GATES

[75] Inventors: Laszlo V. Gal, Poway; Craig T. Prunty, San Diego, both of Calif.

[73] Assignee: Unisys Corporation, Blue Bell, Pa.

[21] Appl. No.: 809,994

[22] Filed: Dec. 18, 1991

[51] Int. Cl.[5] .................. H03K 19/20; H03K 19/0175
[52] U.S. Cl. .................................. 307/475; 307/451; 307/448
[58] Field of Search ............... 307/475, 446, 455, 448, 307/451

[56] References Cited

U.S. PATENT DOCUMENTS

| | | | |
|---|---|---|---|
| 4,656,372 | 4/1987 | Sani et al. | 307/475 |
| 4,719,372 | 1/1988 | Chappell et al. | 307/475 |
| 4,849,660 | 7/1989 | Hayashi et al. | 307/475 |
| 4,977,339 | 12/1990 | Denda | 307/475 |
| 5,047,671 | 9/1991 | Suthar et al. | 307/475 |

Primary Examiner—Edward P. Westin
Assistant Examiner—Andrew Sanders
Attorney, Agent, or Firm—Charles J. Fassbender; Mark T. Starr

[57] ABSTRACT

A signal translator circuit receives digital input signals of one voltage polarity and translates them to digital output signals of an opposite polarity. One embodiment of the translator converts conventional CMOS signal levels of +5 and 0 volts to modified CMOS signal levels of 0 and −5.2 volts. Another embodiment of the translator converts the 0 and −5.2 volt signals to the +5 and 0 volt signals. Both embodiments of the translator are made of transistors whose breakdown voltage only slightly exceeds +5 volts.

16 Claims, 6 Drawing Sheets eq. 1 ~ $VT_N < |V_{TP}|$ eq. 2 ~ $\left(\dfrac{R_N}{R_1+R_N}\right) V^+ < |V_{TP}|$ eq. 3 ~ $R_1 > R_N$ eq. 4 ~ $\dfrac{W_N}{W_1} \rightarrow (1.5-10)$ eq. 11 ~ $VT_P < V_{BD}$ eq. 12 ~ $VT_P < \|V^+ \text{ OR } V^-\|$ eq. 13 ~ $\dfrac{R_P(V^+ + V^-)}{(R_1+R_2+R_P)} < \|V^+ \text{ OR } V^-\|$ eq. 14 ~ $R_2 > R_P$ eq. 15 ~ $\dfrac{W_P}{W_2} \rightarrow (2-10)$ eq. 21 ~ $V_{BD} > \sim_0 = H > 0.8 V^-$ eq. 22 ~ $\|V^+ \text{ OR } V^-\| > \dfrac{R_2(V^+ + V^-)}{(R_1+R_2+R_P)} > 0.8 V^-$ eq. 23 ~ $R_2 > R_1$ eq. 24 ~ $\dfrac{W_1}{W_2} \rightarrow (3-10)$ eq. 31 ~ $VT'_P < |V_{TN}|$ eq. 32 ~ $\left(\dfrac{R_P}{R_2+R_P}\right) V^- < |V_{TN}|$ eq. 33 ~ $R_2 > R_P$ eq. 34 ~ $\dfrac{W_P}{W_2} \rightarrow (1.5-10)$ eq. 41 ~ $VT'_N < V_{BD}$ eq. 42 ~ $VT'_N < \|V^+ \text{ OR } V^-\|$ eq. 43 ~ $\dfrac{R_N(V^+ + V^-)}{(R_1+R_2+R_N)} < \|V^+ \text{ OR } V^-\|$ eq. 44 ~ $R_1 > R_N$ eq. 45 ~ $\dfrac{W_N}{W_1} \rightarrow (2-10)$ eq. 51 ~ $0 < (V_0 = L) < 0.2 V^+$ eq. 52 ~ $0 < V^+ - \left(\dfrac{R_1}{R_1+R_2+R_N}\right)(V^+ + V^-) < 0.2 V^+$ eq. 53 ~ $R_1 > R_2$ eq. 54 ~ $\dfrac{W_2}{W_1} \rightarrow (3-10)$

SIGNAL TRANSLATOR FOR INTERCONNECTING CMOS AND BICMOS LOGIC GATES

BACKGROUND OF THE INVENTION

This invention relates to translators for digital logic signals; and more particularly, it relates to signal translators which enable conventional CMOS logic gates and conventional BiCMOS logic gates to be interconnected and communicate with each other.

Conventional CMOS logic gates (NAND gates, NOR gates, etc.) operate between 0 and +5 volts. That is, the CMOS transistors which make up the logic gates are interconnected between a +5 volt power bus and a ground bus. Input signals and output signals for the CMOS logic gates have a high level of +5 volts and a low level of 0 volts.

By comparison, conventional bipolar logic gates operate between 0 and −5.2 volts. That is, the bipolar transistors which make up the logic gates are interconnected between a ground bus and a −5.2 volt power bus. Input signals and output signals for the bipolar logic gates have a high level of −0.8 volts and a low level of −1.6 volts.

Due to the differences in the power supply voltages and the input and output signal levels of the conventional CMOS logic gates and the conventional bipolar logic gates, those two types of logic gates cannot be connected directly to each other. To solve this problem in the prior art, the conventional CMOS logic gates have been modified by replacing the ground bus with a −5.2 volt power bus and replacing the +5 volt bus with a ground bus. With this change, the high voltage level from the modified CMOS logic gate becomes 0 volts and the low logic level becomes −5.2 volts. Then, to enable such modified CMOS logic gates to be interconnected to the conventional bipolar logic gates, signal translators have been developed which convert the 0 and −5.2 volt modified CMOS logic signals to the −0.8 volt and −1.6 volt bipolar logic signals. Circuits which include these modified CMOS logic gates, signal translators, and bipolar logic gates are called conventional BiCMOS logic circuits.

Despite the development of the above described BiCMOS logic circuits, conventional CMOS logic gates that operate between 0 and +5 volts are still used in many logic systems. And, to interconnect those conventional CMOS logic gates to the modified CMOS logic gates in BiCMOS circuits would require another type of translator which translates +5 and 0 volt signals to 0 and −5 volt signals (and vice versa). This type of translator has not been provided in the prior art.

Such a translator would have to operate between +5 volts and −5 volts. This is because the input signals go up to +5 volts and the output signals go down to −5 volts (or vice-versa). Consequently, the transistors in the translator would be exposed to a voltage difference of 10 volts; and, that in turn presents the question of how to design the translator such that its transistors do not break down.

Clearly, if the transistors in the translator are made with a high breakdown voltage which exceeds 10 volts, then breakdown will be avoided. However, the transistors which make up the conventional CMOS logic gates and the modified CMOS logic gates normally have a breakdown voltage which exceeds their 5 volt signal swing by only a small margin (e.g. a couple of volts). This small breakdown voltage margin is desired because raising the breakdown voltage of a transistor inherently decreases the speed at which the transistor switches.

Breakdown voltage in a transistor can, for example, be increased by increasing the doping concentration of the transistor's source and drain regions. But that inherently increases the source and drain capacitance, which reduces switching speed. Also, if only the transistors in the signal translator are made with a breakdown voltage which exceeds 10 volts, then special steps would have to be added to the fabrication process that is used to make all the other transistors in the conventional CMOS logic gates and modified CMOS logic gates. But, that in turn would increase the cost of the translator.

Accordingly, a primary object of the invention is to provide a signal translator which converts conventional CMOS signal levels of +5 and 0 volts to modified CMOS signal levels of 0 and −5 volts, and which is constructed of transistors whose breakdown voltage is only a couple of volts larger than 5 volts.

BRIEF SUMMARY OF THE INVENTION

In accordance with the present invention, a signal translator circuit receives a conventional CMOS input signal of +5 and 0 volts and produces a modified CMOS output signal of 0 and −5 volts. This translator circuit includes, a first resistance coupled to a positive supply voltage bus and a second resistance coupled to a negative supply voltage bus. Also included is an P-channel transistor, having a source and drain coupled in series between the first and second resistance and having a gate coupled to a ground bus. Further included is a N-channel transistor having a gate coupled to an input terminal for receiving the input signal, and having a source and drain coupled respectively to the gate and source of the P-channel transistor. Lastly, an output terminal is coupled to the drain of the P-channel transistor on which the output signal is generated.

By properly selecting the source-drain resistances of the N-channel and P-channel transistors relative to the first and second resistances, the breakdown voltage of the transistors can be kept at a small margin (e.g.—two volts) above the supply voltages.

Also, when the P-channel transistor is changed to a N-channel transistor, and the N-channel transistor is changed to a P-channel transistor, the circuit translates modified CMOS signal levels to conventional CMOS signal levels. That is, the circuit translates 0 and −5 volt signals to +5 and 0 volt signals.

BRIEF DESCRIPTION OF THE DRAWINGS

Various preferred embodiments of the invention are described in detail herein in conjunction with the accompanying drawings wherein.

DETAILED DESCRIPTION

Figure 1:
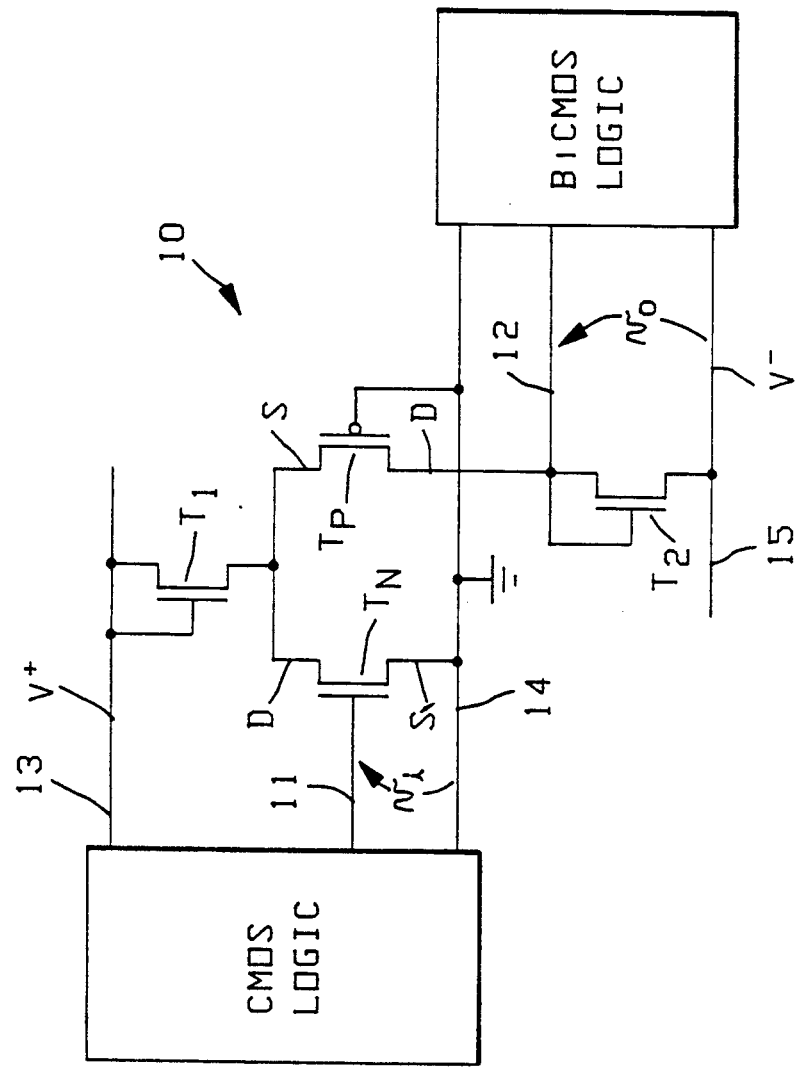
FIG. 1 is a circuit diagram of one embodiment which translates conventional CMOS logic levels to modified CMOS logic levels.

Referring now to FIG. 1, the details of one preferred embodiment of a signal translator circuit 10 that is structured according to the invention will be described. This translator circuit 10 receives digital input signals $v_i$ on a lead 11 which are at CMOS voltage levels; and, it translates those signals into digital output signals $v_o$ on an output lead 12 which are at BiCMOS voltage levels. A high level for the input signals $v_i$ is a positive supply voltage $V+$; a low level for the input signals $v_i$ is ground (zero volts); a high level for the output signals $v_o$ is ground; and a low level for the output signals $v_o$ is a negative supply voltage $V-$. One specific example of the supply voltages $V+$ and $V-$ are $+5$ volts and $-5.2$ volts respectively.

As FIG. 1 shows, the signal translator circuit 10 includes four field effect transistors which are labeled $T_P$, $T_N$, $T_1$, and $T_2$. Those transistors are interconnected between a $V+$ voltage bus 13, a ground bus 14, and a $V-$ voltage bus 15 as shown. Transistor $T_P$ is a P-channel transistor, and the remaining transistors are N-channel transistors. Transistors $T_N$ and $T_P$ have their source labeled S and their drain labeled D; and, they operate in either an ON state or an OFF state as is described below to achieve the desired voltage translation. By comparison, transistors $T_1$ and $T_2$ have their gate connected to their drain, so they merely operate as resistors having respective source-drain resistances $R_1$ and $R_2$.

Figure 2:
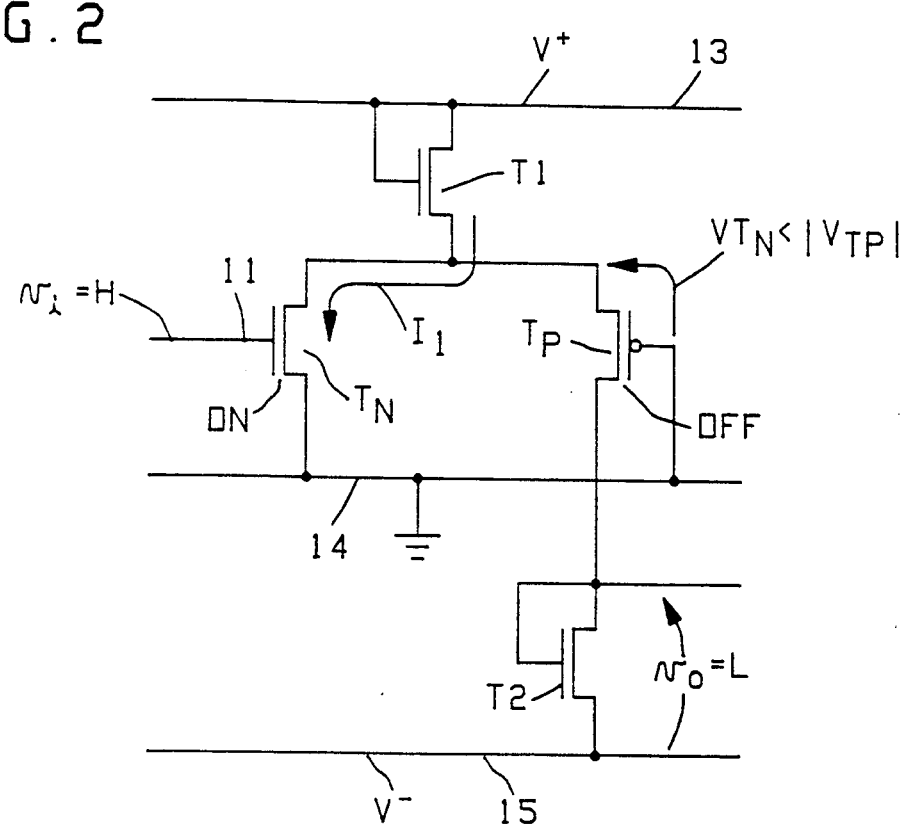
FIG. 2 illustrates the operation of the FIG. 1 embodiment under the condition where the input signal is a high logic level.

When the input signal $v_i$ is at a high voltage level ($v_i = H$), transistor $T_N$ is ON; and, a current $I_1$ flows through the transistors $T_1$ and $T_N$. This is shown in FIG. 2. Current $I_1$ produces a voltage drop across transistor $T_1$; and, due to that voltage drop, the source to gate voltage of transistor $T_P$ is made less than the magnitude of the threshold voltage of transistor $T_P$. Consequently, transistor $T_P$ turns OFF. As a result, no current flows through transistor $T_P$, and so the output voltage $v_o$ on conductor 12 goes low ($v_o = L$).

Figure 3:
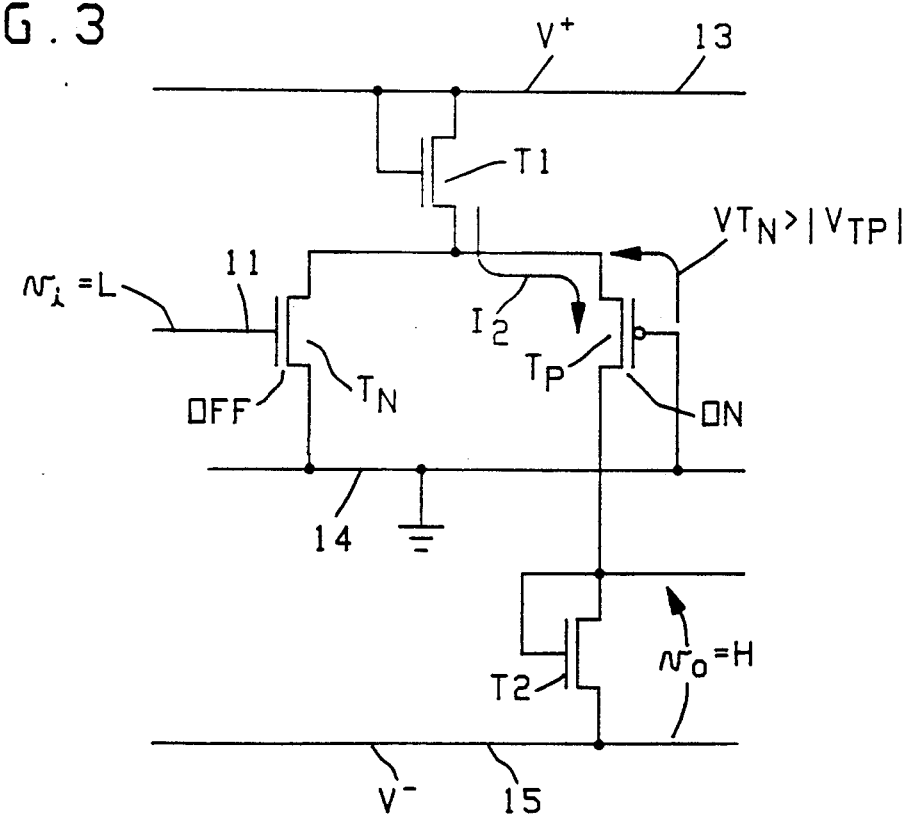
FIG. 3 illustrates the operation of the FIG. 1 embodiment under the condition where the input signal is a low logic level.

Conversely, when the input signal $v_i$ is at a low voltage level, transistor $T_N$ turns OFF; and, the current $I_1$ goes to zero. This is shown in FIG. 3. Due to the stopping of the current $I_1$, the voltage drop across transistor $T_1$ decreases, and that in turn causes the gate to source voltage of transistor $T_P$ to rise and exceed the magnitude of the threshold voltage of transistor $T_P$. Consequently, transistor $T_P$ turns ON. While transistor $T_P$ is ON, a current $I_2$ flows through transistors $T_1$, $T_P$, and $T_2$. This current $I_2$ causes a voltage drop as it passes through transistor $T_2$; and thus, the output voltage $v_o$ goes high.

Figure 4:
FIG. 4 shows three sets of equations which explain in greater detail the operation that is illustrated in FIGS. 2 and 3.
Figure 4:

Now, in order to explain the operation of the translator circuit 10 in greater detail, reference should be made to FIG. 4. There, equations 1 thru 4 apply when transistor $T_N$ is ON and transistor $T_P$ is OFF. In equation 1, the term on the left hand side represents the voltage across transistor $T_N$, and the term on the right hand side represents the magnitude of the threshold voltage of transistor $T_P$. Equation 1 must be met in order to maintain transistor $T_P$ in an OFF state.

Next, the term on the left hand side of equation 1 may be rewritten as shown in equation 2. In equation 2, $R_1$ is the source-drain resistance of transistor $T_1$, and $R_N$ is the source-drain resistance of transistor $T_N$. Current $I_1$ equals the supply voltage $V+$ divided by $R_1 + R_N$; and that current $I_1$ times the resistance $R_N$ equals the voltage $VT_N$.

Inspection of equation 2 shows that the equation can be met if the resistance $R_1$ is larger than resistance $R_N$. This is stated by equation 3. Resistance $R_1$ is inversely proportional to the channel width $W_1$ of transistor $T_1$, and resistance $R_N$ is inversely proportional to the channel width $W_N$ of transistor $T_N$. Consequently, equation 3 can be met by making the channel width $W_N$ larger than the channel width $W_1$. Preferably, as is stated by equation 4, the channel width $W_N$ is limited to being between 1.5 and 10 times larger than the channel width $W_1$.

Next, consider equations 11 thru 15 of FIG. 4. Those equations apply when transistor $T_N$ is OFF and transistor $T_P$ is ON. In equation 11, the left hand term represents the voltage across transistor $T_P$ when it is ON, and the right hand term represents the breakdown voltage of transistor $T_P$. Equation 11 must be met in order to insure that transistor $T_P$ does not break down.

For the reasons that are given in the background portion of this application, the breakdown voltage of transistor $T_P$ is just a couple of volts bigger than the supply voltage $V+$ or the supply voltage $V-$ (whichever is larger). In that case, equation 11 can be written as equation 12 wherein the double vertical lines in the right hand term means "the larger of".

Also in equation 12, the term $VT_P$ is equal to the current $I_2$ as shown in FIG. 3 times the source-drain resistance of transistor $T_P$. By utilizing this relationship, equation 12 can be rewritten as equation 13. There, the resistances $R_1$, $R_2$, $R_P$ respectively are the source-drain resistances of transistors $T_1$, $T_2$, and $T_P$.

Inspection of equation 13 shows that it can be satisfied by making resistance $R_2$ greater than resistance $R_P$. This is stated by equation 14. Resistance $R_2$ is inversely proportional to the width $W_2$ of the channel of transistor $T_2$; and, resistance $R_P$ is inversely proportional to the width $W_P$ of the channel of transistor $T_P$. Preferably, equation 14 is satisfied by imposing the limitation of equation 15 wherein the channel width $W_P$ is limited to being between two and ten times the channel width $W_2$.

Considering now equations 21 thru 24, they also apply when transistor $T_N$ is OFF and transistor $T_P$ is ON. Beginning with equation 21, it states that the high output voltage ($v_O = H$) should be greater than 0.8 times the power supply voltage $V-$. This insures that the high output voltage is substantially larger than the low output voltage, and thus the output voltage swing can be used to switch other transistors (which follow the translator circuit in the BiCMOS logic block) ON and OFF.

At the same time, the high output voltage must not exceed the breakdown voltage $v_{BD}$. Here, the breakdown voltage is just a couple of volts more than the supply voltage $V+$ or the supply voltage $V-$ (whichever is greater), and thus equation 21 can be rewritten as equation 22. Inspection of equation 22 shows that it can be satisfied by making the resistance $R_2$ greater than the resistance $R_1$. This is stated by equation 23. Preferably, equation 23 is met by imposing the constraint of equation 24 wherein the channel width $W_1$ of transistor $T_1$ is made three to ten times larger than the channel width $W_2$ of transistor $T_2$.

Figure 5:
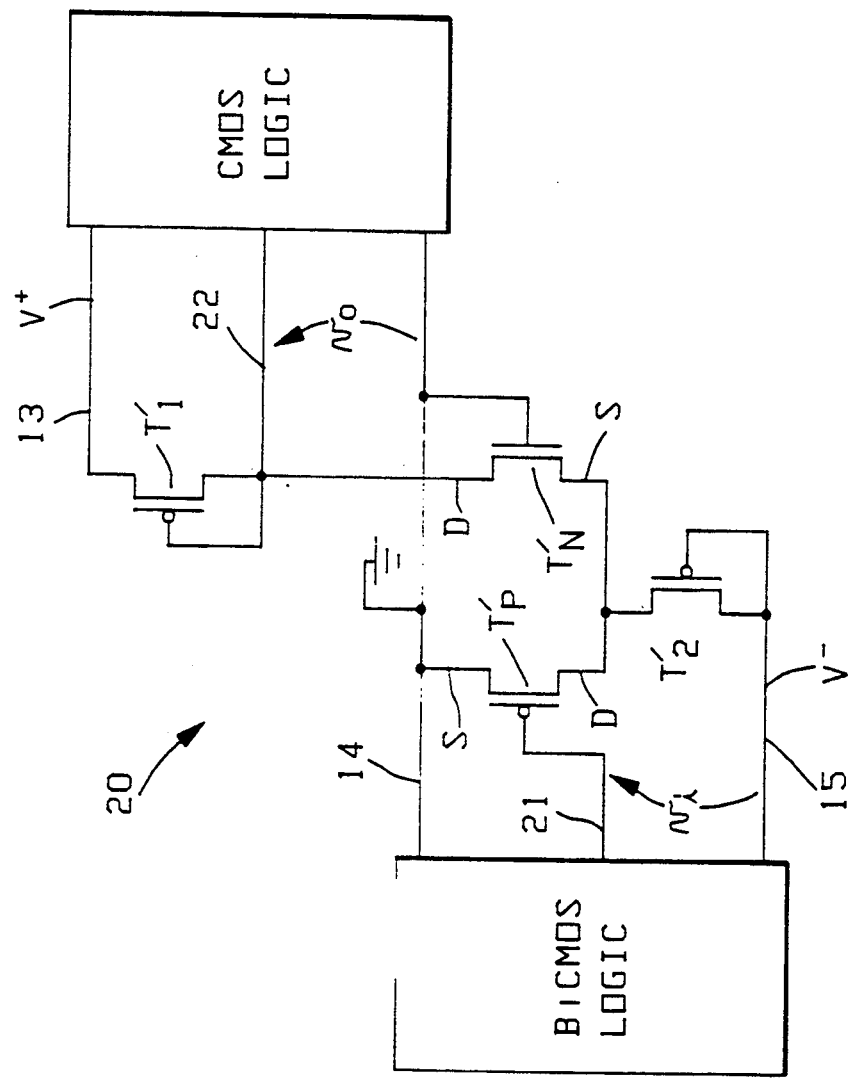
FIG. 5 illustrates a second embodiment of the invention which translates modified CMOS logic levels to conventional CMOS levels.

Turning now to FIG. 5, the details of another preferred embodiment of a signal translator circuit 20 that is structured according to the invention will be described. This translator circuit 20 receives digital input signals $v_i$ on a lead 21 which are at BiCMOS voltage levels; and, it translates those signals into digital output signals $v_o$ on an output lead 22 which are at CMOS voltage levels. A high level for the input signals $v_i$ is ground; a low level for the input signals $v_i$ is the negative supply voltage $V-$; a high level for the output signals $v_o$ is the positive supply voltage $V+$; and a low level for the output signals $v_o$ is ground. In other words, this translator circuit 20 operates to undo the translation which the FIG. 1 translator circuit performs.

As FIG. 5 shows, the signal translator circuit 20 includes four field effect transistors which are labeled $T_P'$, $T_N'$, $T_1'$, and $T_2'$. Those transistors are interconnected between the $V+$ voltage bus 13, the ground bus 14, and the $V-$ voltage bus 15 as shown. Transistor $T_N'$ is a N-channel transistor, and the remaining transistors are P-channel transistors. Transistors $T_N'$ and $T_P'$ have their source labeled S and their drain labeled D; and, they operate in either an ON state or an OFF state as is described below to achieve the desired voltage translation. By comparison, transistors $T_1'$ and $T_2'$ have their gate connected to their drain, so they merely operate as resistors having respective source-drain resistances $R_1'$ and $R_2'$.

Figure 6:
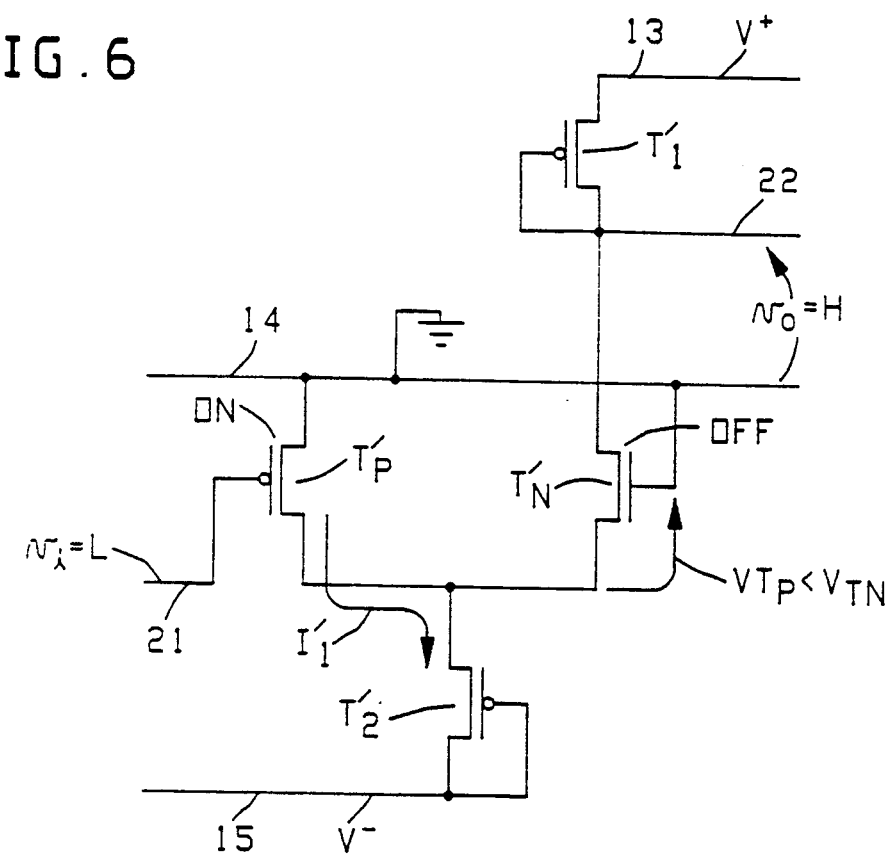
FIG. 6 illustrates the operation of the FIG. 5 embodiment under the condition where the input signal is a low logic level.

When the input signal $v_i$ is at a low voltage level ($v_i=L$), transistor $T_P'$ is ON; and, a current $I_1'$ flows through the transistors $T_P'$ and $T_2'$. This is shown in FIG. 6. Current $I_1'$ produces a voltage drop across transistor $T_2'$; and, due to that voltage drop, the source to gate voltage of transistor $T_N'$ is made less than the magnitude of the threshold voltage of transistor $T_N'$. Consequently, transistor $T_N'$ turns OFF. As a result, no current flows through transistor $T_N'$, and so the output voltage $v_o$ on conductor 22 goes high ($v_o=H$).

Figure 7:
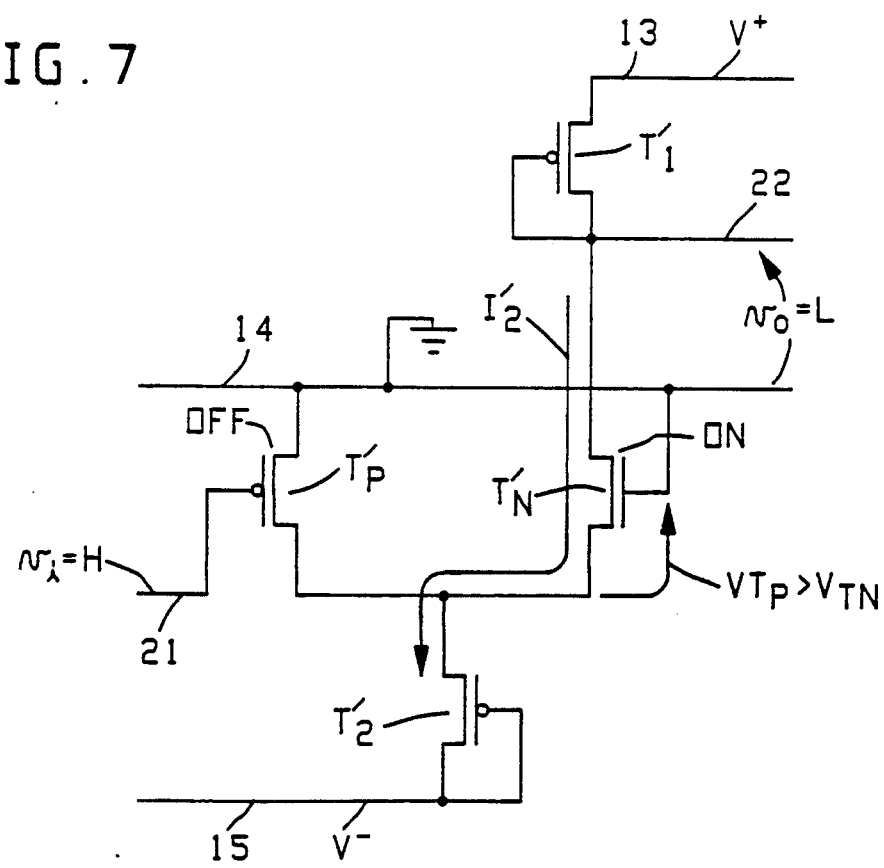
FIG. 7 illustrates the operation of the FIG. 5 embodiment under the condition where the input signal is a high logic level; and, FIG. 8 shows three sets of equations which further explain the operations illustrated in FIGS. 6 and 7.

Conversely, when the input signal $v_i$ is at a high voltage level, transistor $T_P'$ turns OFF; and, the current $I_1'$ goes to zero. This is shown in FIG. 7. Due to the stopping of the current $I_1'$, the voltage drop across transistor $T_2'$ decreases, and that in turn causes the gate to source voltage of transistor $T_N'$ to rise and exceed the magnitude of the threshold voltage of transistor $T_N'$. Consequently, transistor $T_N'$ turns ON. While transistor $T_N'$ is ON, a current $I_2'$ flows through transistors $T_1'$, $T_N'$, and $T_2'$. This current $I_2'$ causes a voltage drop as it passes through transistor $T_1'$; and thus, the output voltage $v_o$ goes low.

Figure 8:
Figure 8:

In order to explain the operation of the translator circuit 20 in greater detail, reference should now be made to FIG. 8. There, equations 31 thru 34 apply when transistor $T_P'$ is ON and transistor $T_N'$ is OFF. In equation 31, the term on the left hand side represents the voltage across transistor $T_P'$, and the term on the right hand side represents the magnitude of the threshold voltage of transistor $T_N'$. Equation 31 must be met in order to maintain transistor $T_N'$ in an OFF state.

Next, the term on the left hand side of equation 31 may be rewritten as shown in equation 32. In equation 32, $R_2'$ is the source-drain resistance of transistor $T_2'$, and $R_P'$ is the source-drain resistance of transistor $T_P'$. Current $I_1'$ equals the magnitude of the supply voltage $V-$ divided by $R_2'+R_P'$; and that current $I_1'$ times the resistance $R_P'$ equals the voltage $VT_P'$.

Inspection of equation 32 shows that the equation can be met if the resistance $R_2'$ is larger than resistance $R_P'$. This is stated by equation 33. Resistance $R_2'$ is inversely proportional to the channel width $W_2'$ of transistor $T_2'$, and resistance $R_P'$ is inversely proportional to the channel width $W_P'$ of transistor $T_P'$. Consequently, equation 33 can be met by making the channel width $W_P'$ larger than the channel width $W_2'$. Preferably, as is stated by equation 34, the channel width $W_P'$ is limited to being between 1.5 and 10 times larger than the channel width $W_2'$.

Next, consider equations 41 thru 45 of FIG. 8. Those equations apply when transistor $T_P'$ is OFF and transistor $T_N'$ is ON. In equation 41, the left hand term represents the voltage across transistor $T_N'$ when it is ON, and the right hand term represents the breakdown voltage of transistor $T_N'$. Equation 41 must be met in order to insure that transistor $T_N'$ does not break down.

For the reasons that are given in the background portion of this application, the breakdown voltage of transistor $T_N'$ is just a couple of volts bigger than the supply voltage $V+$ or the supply voltage $V-$ (whichever is larger). In that case, equation 41 can be written as equation 42 wherein the double vertical lines in the right hand term means "the larger of".

Also in equation 42, the term $VT_N'$ is equal to the current $I_2'$ as shown in FIG. 7 times the source-drain resistance of transistor $T_N'$. By utilizing this relationship, equation 42 can be rewritten as equation 43. There, the resistances $R_1'$, $R_2'$, $R_N'$ respectively are the source-drain resistances of transistors $T_1'$, $T_2'$, and $T_N'$.

Inspection of equation 43 shows that it can be satisfied by making resistance $R_1'$ greater than resistance $R_N'$. This is stated by equation 34. Resistance $R_1'$ is inversely proportional to the width $W_1'$ of the channel of transistor $T_1'$; and, resistance $R_N'$ is inversely proportional to the width $W_N'$ of the channel of transistor $T_N'$. Preferably, equation 34 is satisfied by imposing the limitation of equation 35 wherein the channel width $W_N'$ is limited to being between two and ten times the channel width $W_1'$.

Considering now equations 51 thru 54, they also apply when transistor $T_P'$ is OFF and transistor $T_N'$ is ON. Beginning with equation 51, it states that the low output voltage ($v_o=L$) should be less than 0.2 times the positive supply voltage $V+$. This insures that the low output voltage is substantially smaller than the high output voltage, and thus the output voltage swing can be used to switch other transistors (which follow the translator circuit in the CMOS logic block) ON and OFF.

At the same time, the low output voltage must not be so low that breakdown voltage $v_{BD}$ across transistor $T_1'$ is exceeded. Here, the breakdown voltage is just a couple of volts more than the supply voltage $V+$ or the supply voltage $V-$ (whichever is greater), and so breakdown can be prevented by requiring the low output voltage to exceed zero volts. Equation 51 can be rewritten as equation 52 by utilizing the relation that the low output voltage equals the positive supply voltage $V+$ minus the voltage drop across transistor $T_1'$. Inspection of equation 52 shows that it can be satisfied by making the resistance $R_1'$ greater than the resistance $R_2'$. This is stated by equation 53. Preferably, equation 53 is met by imposing the constraint of equation 54 wherein the channel width $W_2'$ of transistor $T_2'$ is made three to ten times larger than the channel width $W_1'$ of transistor $T_1'$.

Two preferred embodiments of the invention have now been described in detail. In addition, however, various modifications can be made to those detailed embodiments without departing from the nature and spirit of the invention. For example, in the future, the transistors which make up the CMOS logic gates and modified CMOS logic may be scaled down in size. In that case the $V+$ and $V-$ voltages may also be reduced from $+5$ and $-5.2$ volts. However, the circuit structure for the translator of FIGS. 1 and 5 can remain the same even when the $V+$ and $V-$ voltages are lowered to about $+3$ and $-3$ volts. Also, as one other modification, the transistors $T_1$, $T_2$, $T_1'$, and $T_2'$ can be fabricated as resistors.

Accordingly, it is to be understood that the invention is not limited to the detail of the illustrated preferred embodiment, but is defined by the appended claims.

We claim:

1. A signal translator circuit, which receives digital input signals of one voltage polarity and produces a digital output signals with an opposite polarity, comprising:

a first resistance means coupled to a positive voltage bus and a second resistance means coupled to a negative voltage bus;

a P-channel transistor having a source and drain coupled in series between said first and second resistance means and having a gate coupled to a ground bus;

an N-channel transistor having a gate coupled to an input terminal for receiving said input signal, and having a source and drain coupled respectively to said gate and source of said P-channel transistor; and, an output terminal coupled to said drain of said P-channel transistor on which said output signal is generated.

2. A circuit according to claim 1 wherein said first resistive device has a resistance $R_1$, said N-channel transistor has an ON drain-source resistance $R_N$, said P-channel transistor has a threshold voltage $V_{TP}$, said positive voltage bus carries a voltage $V+$, and: $V+R_N/(R_N+R_1) < |V_{TP}|$.

3. A circuit according to claim 2 wherein said second resistive device has a resistance $R_2$, said P-channel transistor has an ON source-drain resistance $R_P$, said negative voltage bus carries a voltage $V-$, and: $(V++V-)(R_P)/(R_1+R_2+R_P) < $ (larger of $V+$ and $V-$).

4. A circuit according to claim 3 wherein: (larger of $V+$ and $V-$) $> (V++V-)R/2/(R_1+R_2+R_P) > 0.8$ (larger of $V+$ and $V-$).

5. A circuit according to claim 4 wherein: $R_1 > R_N$, $R_2 > R_P$, $R_2 > R_1$.

6. A circuit according to claim 5 wherein: $R_1/R_N$ is between 1.5 and 10.

7. A circuit to claim 5 wherein: $R_2/R_P$ is between 2 and 10.

8. A circuit according to claim 5 wherein: $R_2/R_1$ is between 3 and 10.

9. A circuit according to claim 1 wherein said second resistive device has a resistance $R_2$, said P-channel transistor has an ON drain-source resistance $R_P$, said N-channel transistor has a threshold voltage $V_{TN}$, said negative voltage bus carries a voltage $V-$, and $V-R_P/(R_P+R_2) < |V_{TN}|$.

10. A circuit according to claim 9 wherein said first resistive device has a resistance $R_1$, said N-channel transistor has an ON source-drain resistance $R_N$, said positive voltage bus carries a voltage $V+$, and: $(V++V-)R_N/(R_1+R_2+R_N) < $ (larger of $V+$ and $V-$).

11. A circuit according to claim 10 wherein: $0 < V+ - (V++V-)R_2/(R_1+R_2+R_N) < 0.2V+$.

12. A circuit according to claim 11 wherein: $R_2 > R_P$, $R_1 > R_N$, $R_1 > R_2$.

13. A circuit according to claim 11 wherein: $R_2/R_P$ is between 1.5 and 10.

14. A circuit to claim 11 wherein: $R_1/R_N$ is between 2 and 10.

15. A circuit according to claim 11 wherein: $R_1/R_2$ is between 3 and 10.

16. A signal translator circuit, which receives digital input signals of one voltage polarity and produces a digital output signals with an opposite polarity, comprising:

a first resistance means coupled to a positive voltage bus and a second resistance means coupled to a negative voltage bus;

an N-channel transistor having a source and drain coupled in series between said first and second resistance means and having a gate coupled to a ground bus;

a P-channel transistor having a gate coupled to an input terminal for receiving said input signal, and having a source and drain coupled respectively to said gate and source of said N-channel transistor; and, an output terminal coupled to said drain of said N-channel transistor on which said output signal is generated.

* * * * *